United States Patent [19]

Imazeki

[11] 4,245,348
[45] Jan. 13, 1981

[54] CENTER FREQUENCY TUNING SYSTEM FOR RADIO-FREQUENCY SIGNAL RECEIVER

[75] Inventor: Kazuyoshi Imazeki, Tokyo, Japan
[73] Assignee: General Research of Electronics, Inc., Tokyo, Japan
[21] Appl. No.: 801,084
[22] Filed: May 27, 1977
[51] Int. Cl.³ .......................... H04B 1/10; H04B 1/16
[52] U.S. Cl. .................................... 455/158; 455/165; 455/194; 455/212; 455/222
[58] Field of Search ............... 325/348, 455, 402, 403, 325/478, 470, 469, 419–423; 455/158, 165, 164, 194, 212, 222

[56] References Cited

U.S. PATENT DOCUMENTS

| | | | |
|---|---|---|---|
| 3,319,169 | 5/1967 | Axe ..................................... | 325/478 |
| 3,492,584 | 1/1970 | Takahashi .......................... | 325/470 |
| 3,543,165 | 11/1970 | Tomsa ................................ | 325/478 |
| 3,766,483 | 10/1973 | Wolfram ............................. | 325/470 |
| 3,821,651 | 6/1974 | Fathauer et al. ................... | 325/470 |
| 3,869,674 | 3/1975 | Borbely .............................. | 325/423 |
| 3,947,774 | 3/1976 | Glennon et al. .................... | 325/470 |
| 3,961,261 | 6/1976 | Pflasterer ........................... | 325/470 |
| 4,008,437 | 2/1977 | Sakauchi et al. ................... | 325/470 |
| 4,009,440 | 2/1977 | Okada et al. ....................... | 325/470 |
| 4,123,716 | 10/1978 | Borg .................................. | 325/470 |

OTHER PUBLICATIONS

Radio–Electronics, May 1973 on "Heath's Digital FM Tuner" by Thomas, pp. 42–45, 50, 98.

*Primary Examiner*—Jin F. Ng
*Attorney, Agent, or Firm*—Trexler, Wolters, Bushnell & Fosse, Ltd.

[57] ABSTRACT

A system is provided for developing a gating signal when a radio-frequency signal receiver is tuned to the center-frequency of a selected radio-frequency signal. The system comprises circuit means for tuning the receiver to a plurality of frequencies within a range of frequencies which includes the selected signal and for producing an intermediate frequency signal corresponding to the frequency to which the receiver is tuned. A frequency discriminator is coupled to the circuit means and is tuned to a predetermined frequency, with the frequency discriminator being responsive to the intermediate frequency signal for developing an output signal having a DC component which varies systematically in accordance with the deviation of the intermediate frequency signal from said predetermined frequency. A detector is coupled to the frequency discriminator and is responsive to the DC signal component for developing a gating signal, with the gating signal having a first value when the DC component has a value between preselected upper and lower threshold values and with the gating signal having a second value when the DC component has a value which is not between the upper and lower threshold values. A gating circuit is coupled between the circuit means and an electromechanical transducer and is responsive to the gating signal for enabling reproduction of audio signals by the transducer only when the gating signal has the first value.

5 Claims, 5 Drawing Figures

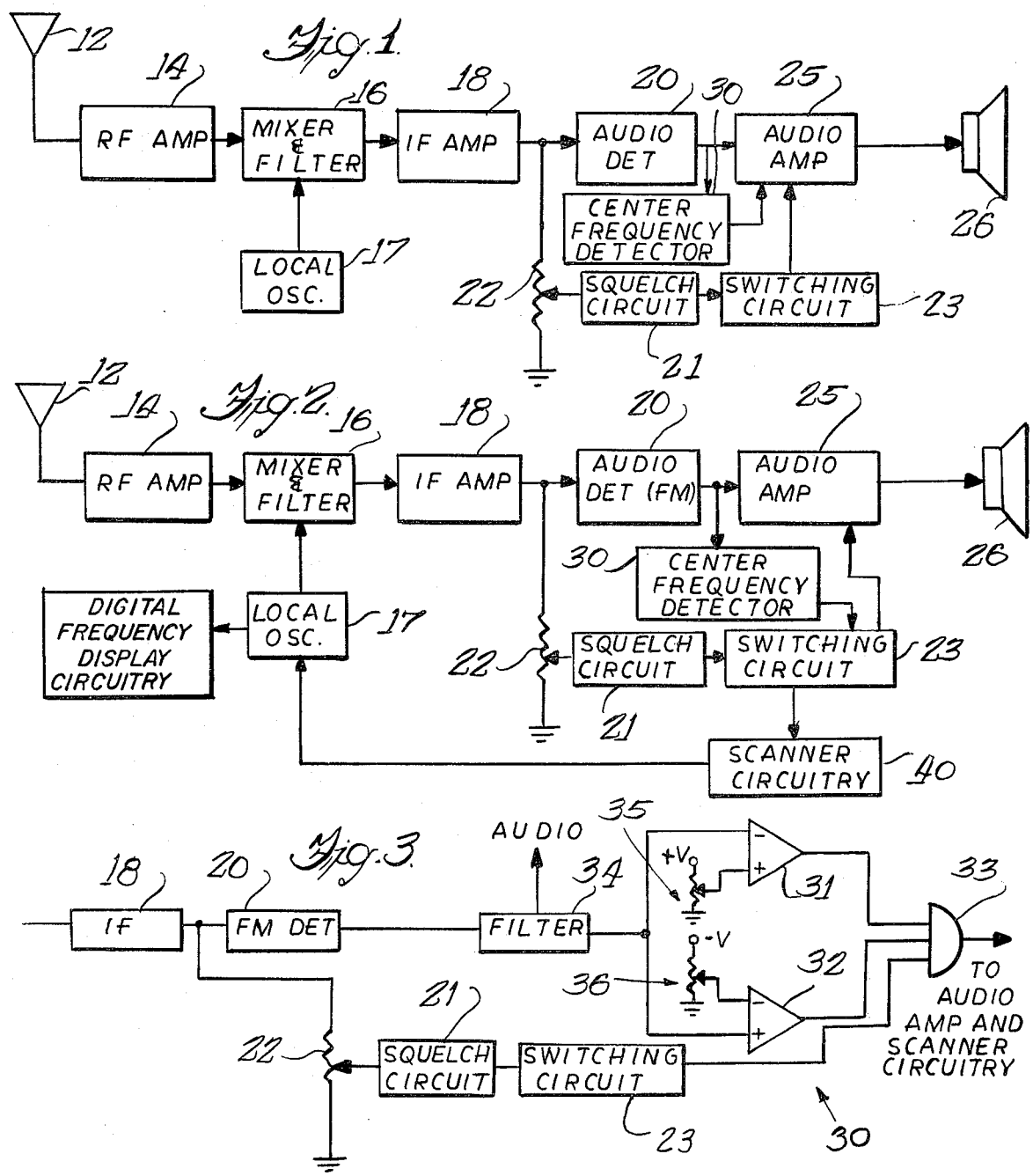
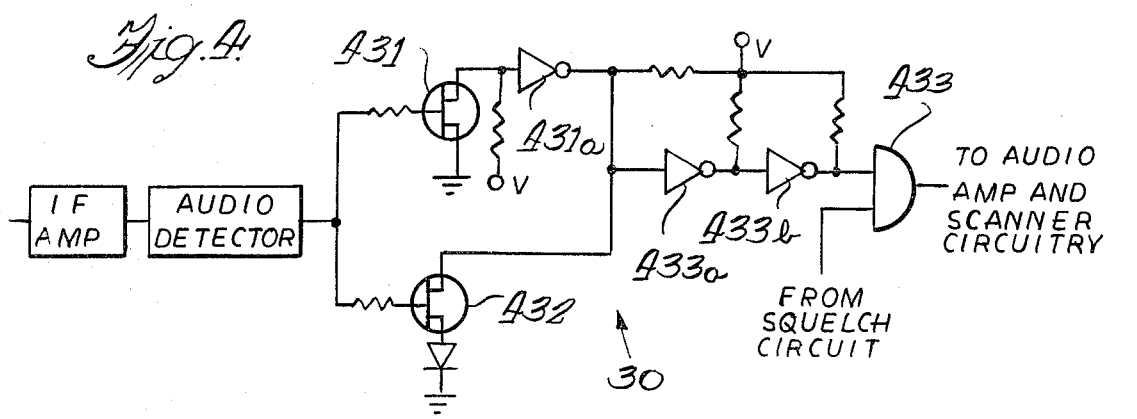

Fig. 5
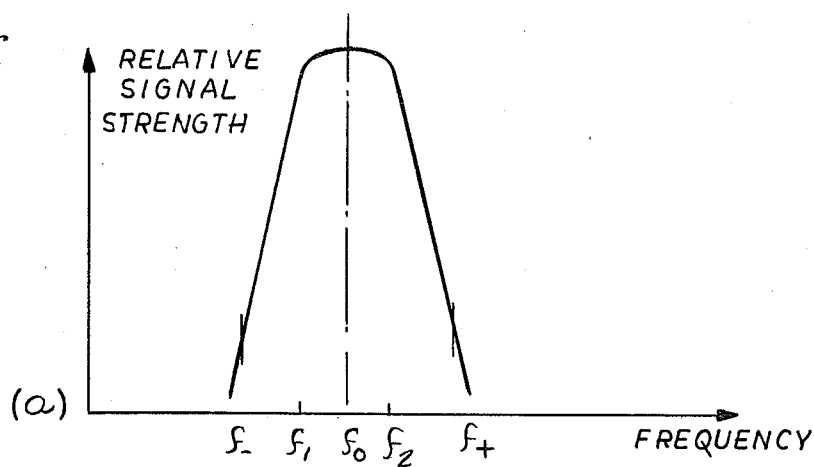
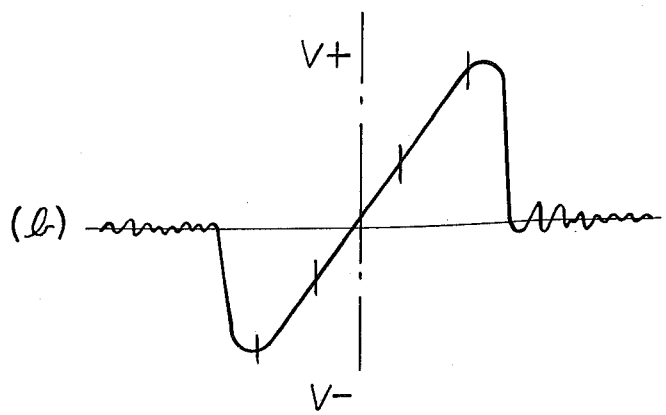
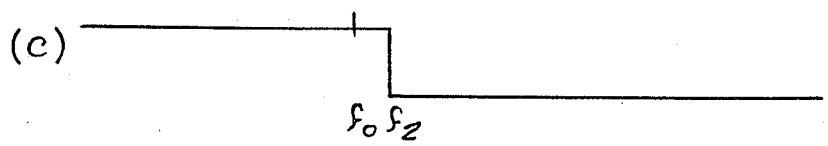
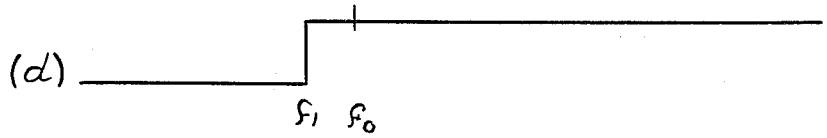
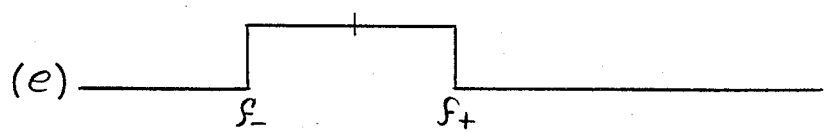
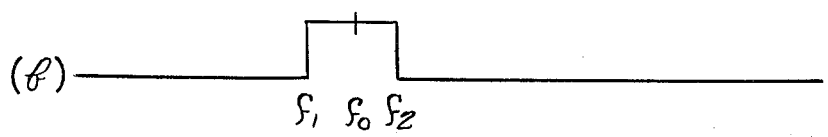

CENTER FREQUENCY TUNING SYSTEM FOR RADIO-FREQUENCY SIGNAL RECEIVER

BACKGROUND OF THE INVENTION

In conventional radio-frequency signal receivers, the output signal is generally of better quality when the receiver is tuned as close as possible to the carrier or center frequency of the transmitted radio-frequency signal which the operatpr or listener desires to receive. It is well known that when an AM or FM receiver, for example, is tuned to a frequency somewhat removed from the center frequency of the selected station or channel, a significant amount of undesired noise will be present in the audio output of the receiver. As the receiver is tuned to frequencies closer to the center frequency, the audio output becomes less noisy (i.e., the signal-to-noise ratio increases) until the optimum is attained at or very near the center frequency.

In manually-tuned radio-frequency signal receivers, the tuning mechanism may be adjusted until an audio signal is produced which is acceptable to the listener, and a device such as a signal strength meter may be provided to visually aid in the manual tuning thereof. In addition, an automatic frequency control (AFC) circuit may be used to automatically tune the receiver to the center frequency after the receiver has been manually tuned to somewhere within the limits of the control range of the AFC circuit. Another conventional tuning aid is a squelch or muting circuit which, as its name implies, prevents the receiver from producing an audio output signal unless the received signal has a predetermined strength or level.

None of these circuits, however, provides a gating or control signal when the receiver is tuned at or very close to the center frequency of the received radio-frequency signal, and this shortcoming is particularly disadvantageous in a receiver of the scanning type, especially when the selected frequencies of interest are tuned to by means of a digitally-synthesized frequency-generating circuit. This circuit sometimes takes the form of a phase-locked loop (PLL) circuit controlled by a programmable divider.

In a signal-seeking or scanning receiver, a scanning circuit is provided which typically varies the frequency of the local oscillator, either continuously or in preset increments, and a detector circuit is used to stop the scanning operation when a desired signal of adequate strength is received. This detector circuit is often similar to, or part of, a squelch circuit. Conventional detector circuits of this type are made user-adjustable in order to accommodate or compensate for the differences in the strength of the various received signals. Such differences in signal strength can be attributed to a number of factors including differences in distances and orientation between the transmitting antenna and receiving antenna for the various frequencies of interest, as well as differences in the power of the various transmitters. Thus, it is extremely difficult if not impossible to adjust such a circuit so that it will trigger at a preset level of signal strength to provide optimum (i.e., center-frequency) tuning for all signals of interest.

A compromise therefore is often made by broadening the range (e.g., lowering the threshold signal level) of the detector or squelch circuit. This can result in the scanning receiver stopping at a frequency other than the center frequency, especially when the variable tuning is accomplished incrementally as it is in a digital frequency synthesizer circuit. In other words, as the scanner tunes to a strong signal, the threshold signal level for stopping the scanning action will be reached before the scanner tunes to the center frequency at which the signal is strongest. Moreover, if in such a scanner means are provided for displaying the frequency to which the receiver has tuned, the frequency displayed will likewise not be the center frequency.

Accordingly, it is an object of the invention to provide a new and improved system for developing a gating signal when a radio frequency signal receiver is tuned to the center frequency of a selected radio frequency signal.

It is another object of the invention to provide such a new and improved system which is particularly adapted for use in a scanning receiver.

It is a more specific object of the invention to provide such a new and improved system in a scanning receiver of the type which utilizes a digital frequency synthesizer circuit having a digital frequency display of the frequency to which the receiver is tuned.

SUMMARY OF THE INVENTION

In accordance with the present invention, a new and improved system for developing a gating signal when a radio-frequency signal receiver is tuned to the center frequency of a selected radio-frequency signal comprises circuit means for tuning the receiver to a plurality of frequencies within a range of frequencies which includes the selected signal and for producing an intermediate frequency signal corresponding to the frequency to which the receiver is tuned. Frequency discriminator means are coupled to the circuit means and are tuned to a predetermined frequency, with the frequency discriminator means being responsive to the intermediate frequency signal for developing an output signal having a DC component which varies systematically in accordance with the deviation of the intermediate frequency signal from the predetermined frequency. Also provided are detecting means coupled to the discriminator means and responsive to the DC signal component for developing a gating signal with the gating signal having a first value when the DC component has a value between preselected upper and lower threshold values and with the gating signal having a second value when the DC component has a value which is not between said upper and lower threshold values.

BRIEF DESCRIPTION OF THE DRAWINGS

The features of the present invention which are believed to be novel are set forth with particularity in the appended claims. The organization and manner of operation of the invention, together with further objects and advantages thereof, may best be understood by reference to the following detailed description taken in conjunction with the accompanying drawings in the several figures of which like reference numerals identify like elements and in which:

FIG. 1 is a schematic diagram in block form of a radio-frequency signal receiver which utilizes a preferred embodiment of the present invention;

FIG. 2 is a schematic diagram in block form of a radio-frequency signal receiver, similar to that of FIG. 1, but which includes scanning circuitry and utilizes a preferred embodiment of the present invention;

FIG. 3 is a schematic circuit diagram, partially in block form, illustrating a preferred embodiment of the circuitry of the present invention utilized in the receiver of FIGS. 1 and 2;

FIG. 4 is a schematic circuit diagram illustrating a specific circuit which may be employed in the embodiment of the invention illustrated in FIG. 3;

FIG. 5 is a graphical representation of some of the waveforms which occur in the preferred embodiment of the invention illustrated in FIGS. 3 and 4 which are helpful in understanding the invention.

DESCRIPTION OF THE PREFERRED EMBODIMENT

With reference to FIG. 1, there is shown a system for developing a gating signal when a radio-frequency signal receiver is tuned to the center frequency of a selected radio-frequency signal, which system is constructed in accordance with the principles of the present invention. Circuit means comprising antenna 12, radio-frequency (RF) amplifier 14, mixer and filter circuitry 16, local oscillator 17 and intermediate-frequency (IF) amplifier 18 are provided for tuning the receiver to a plurality of frequencies within a range of frequencies which includes the desired or selected signal, and for producing an intermediate frequency signal corresponding to the frequency to which the receiver is tuned. This frequency range may of course include frequencies from different designated frequency bands (e.g., VHF and UHF) to which it is desired to tune the receiver. All of this circuitry may take the form of conventional, wellknown circuitry and therefore is not described in greater detail. It is also understood that local oscillator 17, together with related circuitry, may tune the receiver continuously throughout its reception range or may tune the receiver in preselected discrete increments within its reception range without departing from the principles of the invention.

Frequency discriminator means in the form of an audio detector 20 are coupled to IF amplifier 18 in the conventional fashion and tuned to a predetermined frequency. In an FM receiver, for example, this predetermined frequency is typically 10.7 megahertz. In some VHF communication receivers, on the other hand, IF amplifier circuitry 18 may include what is sometimes referred to as double conversion superheterodyning in which the received signal is first converted to 10.7 megahertz and then that signal is converted to 455 kilohertz. It is understood that the principles of the invention may be applied to either system, as well as any other conventional superheterodyne tuning system. The frequency discriminator (audio detector 20 itself in this embodiment of the invention) is responsive to the intermediate frequency signal for developing an output signal which has a DC component which varies systematically in accordance with (e.g. is directly proportional to) the deviation of the intermediate frequency from the predetermined frequency. Audio detector 20 also develops an AC audio signal which is ultimately amplified by an audio amplifier 25 and reproduced by an electromechanical transducer in the form of a speaker 26 to reproduce the audio sound in a well-known manner. In other embodiments of the invention such as an AM receiver, for example, where the audio detector does not include a frequency discriminator, a frequency discriminator circuit separate from the audio detector may be coupled to the IF amplifier and respond to the IF signal to develop the DC output signal employed by the present invention.

As is well known, a frequency discriminator is a device which produces an output voltage proportionate to the input frequency. The discriminator is usually tuned about a given frequency (e.g. the intermediate frequency) and the output voltage is proportional to the deviation of the input frequency from this point. A graphical representation of the output of a frequency discriminator circuit is illustrated in FIG. 5b, as hereinafter discussed in greater detail.

In the system of FIG. 1, a conventional squelch circuit 21 having variable threshold setting means in the form of a potentiometer 22 are employed to activate a switching circuit 23 in the conventional manner to respond to the intermediate frequency signal and produce a control signal having a first value when a predetermined intermediate frequency signal (e.g. 10.7 MHz) has an amplitude above a preselected threshold value and having a second value when the predetermined intermediate frequency signal has an amplitude below the preselected value. It is generally preferable to make the squelch circuit responsive to the intermediate frequency signal (which corresponds to the carrier frequency of the received signal) rather than being responsive to the audio signal modulated on the carrier (as is true of some prior art receivers) because of the continuous nature of the carrier-frequency signal as opposed to the often discontinuous nature of the audio signal. Making the squelch circuit responsive to the audio signal, therefore, would cause the output signal to be turned on and off frequency (e.g. at the beginning and end of each spoken word or during a brief pause in the conversation) and, in the case of a scanner, would cause it to tune to another frequency whenever there is a short interruption in the audio signal. The circuit of the present invention does not have such shortcomings.

The control signal operates switching circuit 23 which is coupled between IF amplifier 18 and speaker 26 and is responsive to the control signal having the first value for enabling reproduction of audio signals by the speaker only when the amplitude of the intermediate frequency signal is above the threshold value. Although the squelch circuitry itself is essentially conventional, its utilization here in conjunction with the center frequency detector circuit 30 provides an important feature of the invention in that it prevents the system of the invention from possible false triggering, as hereinafter described in greater detail.

In accordance with one aspect of the invention, detecting means in the form of center frequency detector 30 are provided in the embodiment of the invention illustrated in FIG. 1. Detector 30 is coupled to the audio detector 20 and is responsive to the DC signal component developed by audio detector 20 for developing a gating signal. The gating signal has a first value when the DC component is between preselected upper and lower threshold values and the gating signal has a second value when the DC component is not between the upper and lower threshold values. This gating signal may therefore be used to enable and disable the audio amplifier 25, for example, either directly (as shown in FIG. 1) or by means of switching circuit 23 (as shown in FIG. 2). By selecting the upper and lower threshold values to be very close to each other, in accordance with the features of the invention, the system of the invention may thus be set to enable audio signal reproduction only when the receiver is tuned to (or very close to) the center frequency of the received signal.

With reference to FIG. 2, there is shown a preferred embodiment of the invention similar to that shown in FIG. 1 but with the addition of the scanner circuitry 40 to enable the receiver to automatically scan a plurality of predetermined radio frequencies and tune to a received signal having a frequency corresponding to one of the predetermined frequencies. Such receivers are commonly referred to as scanning or signal-seeking receivers. The embodiment of the scanning receiver illustrated in FIG. 2 is constructed in accordance with the principles of the present invention and is responsive to the gating signal developed by center frequency detector 30 for causing the receiver to sequentially tune to a plurality of radio frequencies when the gating signal is of one value and to stop scanning when the gating signal has its other value. This circuit thus insures that the receiver continues scanning until it is tuned to the center frequency of a received signal.

As illustrated in FIG. 2, the scanning receiver embodiment of the invention comprises variable tuning means in the form of an antenna 12, RF amplifier 14, mixer and filter circuitry 16, local oscillator 17, and IF amplifier 18 to selectively and sequentially tune the receiver to the predetermined frequencies and produce a corresponding intermediate frequency signal. There are at least several known techniques for accomplishing this end, including the use of varactor diodes, precision crystals, or programmable frequency synthesizer circuits for the local oscillator to tune the receiver to the desired frequencies. For further details of suitable scanning circuitry, reference may be had to U.S. Pat. Nos. 3,794,925-Imazeki and 3,801,914-Imazeki, both of which are assigned to the assignee of the present invention. In the embodiment of the invention illustrated in FIG. 2, scanning means in the form of scanner circuitry 40 are provided between the switching circuit 23 (which is responsive to the gating signal developed by center frequency detector 30) and local oscillator 17 for causing the variable tuning means to automatically and sequentially tune the receiver to each of the desired frequencies and stop when it has tuned to the center frequency of a received frequency. It is understood, of course, that the particular method used for scanning and tuning the receiver may be of any design suitable for the application for which the receiver is intended without departing from the principles of the present invention.

In the embodiment of the invention illustrated in FIG. 2, as with the embodiment illustrated in FIG. 1, frequency discriminator means are provided in the form of an FM audio detector 20 which is coupled to the IF amplifier 18 and tuned to a predetermined frequency such as 10.7 megahertz. Again, as with the embodiment of the invention illustrated in FIG. 1, the embodiment of FIG. 2 may utilize an FM audio detector 20 which by its nature provides the required DC voltage which is proportional to the deviation of the input frequency from the tuned frequency (e.g. 10.7 megahertz) because it typically is either a frequency discriminator or ratio detector circuit. In other embodiments of the invention where a different type of audio detector circuit is employed, a separate frequency discriminator circuit may be utilized in accordance with the principles of the invention to provide the output signal which is proportional to the deviation of the input frequency from the center frequency of the intermediate frequency amplifier.

Detecting means are provided in the embodiment illustrated in FIG. 2 in the form of a center frequency detector 30 which is coupled to FM audio detector 20 and is responsive to the DC signal component developed by detector 20 for developing a control signal, with the control signal having a first value when the DC component is between preselected upper and lower threshold values and having a second value when the DC component is not between these values, as hereinafter discussed in greater detail with reference to FIG. 3.

Switching means are provided in the form of a switching circuit 23 which is coupled to scanning circuitry 40 and is responsive to the gating signal from center frequency detector 30 for stopping the scanning only when the control signal has the first value; that is, only when the DC component of the output signal of FM audio detector 20 is between the preselected upper and lower threshold value, which values correspond to the receiver being tuned to the center frequency of the received signal. Moreover, if a digital readout circuit is employed to visually indicate the frequency to which the receiver is tuned, the system of the invention will likewise ensure that the displayed frequency is the exact center frequency of the received signal, not merely an approximation.

A squelch circuit 21 including a variable control in the form of a potentiometer 22 is employed to provide a conventional squelch function which cooperates with the center frequency detector to prevent possible mistriggering of the center frequency detection system outside of the frequency discriminator range, as described in greater detail below with respect to FIG. 3.

Turning now to FIG. 3, there is shown a more detailed circuit diagram of a preferred embodiment of the system of the invention. The intermediate frequency amplifier 18, the audio detector 20, squelch circuit 21, and switching circuit 23 are essentially identical to the like-numbered elements of FIGS. 1 and 2 and are shown again in FIG. 3 to facilitate the description thereof. The center frequency detector 30 is shown in greater detail and it includes a pair of voltage comparators 31, 32 and an AND gate 33. The inverting input of comparator 31 and the non-inverting input of comparator 32 are connected to a filter 34 which separates the composite AC and DC output signal of detector 20 into an AC audio component, which is applied to an audio amplifier (not shown in FIG. 3), and a DC component which is thus applied to comparators 31, 32. The non-inverting input of comparator 31 and the inverting input of comparator 32 are respectively coupled to a pair of biasing networks 35, 36 which here take the form of potentiometers. Comparator 31 is thus set by potentiometer 35 to develop a preselected output voltage (e.g. a "low") when the DC signal from filter 34 exceeds the predetermined positive magnitude, and comparator 32 is set by potentiometer 36 to develop a preselected output voltage (e.g. a "low") when the DC signal from filter 34 exceeds a predetermined negative magnitude. Potentiometers 35, 36 may of course be adjusted (e.g. +0.5 and −0.5 volts respectively) to make the range of DC input signal which produces a "high" output for both comparators very narrow, thus corresponding to the center frequency of the received signal. In applications of the invention utilizing frequency-synthesizer circuitry where the tuning frequency is adjusted in discrete increments, this range should not be made narrower than the increments in order to avoid the possibility of skipping over the desired center frequency.

AND gate 33 has three input terminals in the embodiment of the invention illustrated in FIG. 3, two input terminals for the outputs of comparators 31,32 and a third input terminal for the output of switching circuit 23. Thus AND gate 33 develops a predetermined output voltage (e.g. a "high") only when the output signal of both comparators 31,32 and that of switching circuit 23 are all "high". The output of AND gate 33 may be used to control the audio amplifier (not shown in FIG. 3), for example, to enable an audio output from the receiver only when it is tuned to a center frequency above the squelch threshold. In addition, the output of AND gate 33 may similarly be utilized, in accordance with another feature of the invention, to control suitable scanner circuitry (not shown in FIG. 3) to cause the scanning operation to stop only when the receiver is tuned to a center frequency above the squelch threshold.

With reference to FIG. 4, there is shown a schematic circuit diagram illustrating a specific circuit which may be advantageously employed in the embodiment of the invention illustrated in FIG. 3. The center frequency detector is generally indicated by reference character 30 and, in accordance with another feature of this invention, it utilizes a relatively simple and economical circuit to practice the invention. Specifically, comparators 31,32 of the embodiment of FIG. 3 are effectuated in the embodiment of FIG. 4 by a pair of field-effect transistors 431,432 and an inverter 431a, with the biasing being accomplished by the use of a forward-biased diode in the drain circuit of transistor 432. This typically provides a bias of 0.5 volts. The outputs (that of transistor 431 is inverted by inverter 431a) are effectively combined in AND-gate fashion at the input of an inverter 433a. Inverter 433b restores proper polarity and augments signal strength, and its output is applied to one input of a two-input AND gate 433. The various fixed resistors connected between a suitable supply voltage "V" and the inputs and outputs of these inverters are conventional "pull-up" resistors. The other input of AND gate 433 is coupled to the output of a conventional squelch circuit (not shown in FIG. 4) and the output of AND gate 433 is applied to an audio amplifier and/or scanner circuitry (not shown in FIG. 4) as hereinabove discussed. Thus, the invention may be carried out with relatively few, inexpensive components.

In FIG. 5, there is shown graphical representations which illustrate some of the waveforms which occur in the embodiment of the invention illustrated in FIGS. 3 and 4. Waveform (a) represents a response curve for a typical IF output, with the lower and upper limits being designated $f_-$ and $f_+$, respectively, and with $f_0$ representing the center frequency. Waveform (b) represents the DC component of the output of the frequency discriminator, the output signal being one which has a magnitude which varies systematically in accordance with the deviation of the intermediate frequency from the predetermined frequency $f_0$. It may be noted that in this embodiment the magnitude ranges from a negative value at $f_-$ to a positive value at $f_+$, with a value of approximately zero at $f_0$. Waveform (c) represents the output of comparator 31, having a "high" value until the voltage of waveform (b) exceeds the predetermined positive magnitude at $f_2$ whereupon it becomes "low". Conversely, waveform (d) represents the output of comparator 32, having a "low" value until the voltage of waveform (b) attains the predetermined negative value at $f_1$ whereupon it becomes "high". Waveform (e) represents the range of the squelch circuit, from a low threshold at $f_-$ to a high threshold at $f_+$. Finally, waveform (f) represents the output of AND gate 33, which is "high" (to enable the audio amplifier and/or scanning circuitry) only between $f_1$ and $f_2$. As discussed previously, the triggering voltage of comparators 33 and 32 may be set such that $f_1$ and $f_2$ are so close as to equal $f_0$ for practical purposes.

Thus there has been shown and described a new and improved center frequency tuning system for a radio-frequency receiver. Such a system may be used in a manually tuned receiver or in a scanning or signal-seeking receiver, and it is especially well adapted for receivers which utilize a digital frequency synthesizer circuit, particularly those with a digital frequency display, to insure that the receiver is tuned to and displays the center frequency of the displayed signal. Such a system improves the quality of reception and it may be constructed with relatively few, inexpensive components.

While particular embodiments of the invention have been shown and described in detail, it will be obvious to those skilled in the art that changes and modifications of the present invention, in its various aspects, may be made without departing from the invention in its broader aspects, some of which changes and modifications being apparent only after study and others being matters of routine engineering or design. As such, the scope of the invention should not be limited by the particular embodiment and specific construction described herein which should be defined by the appended claims, and equivalents thereof. Accordingly, the aim in the appended claims is to cover all such changes and modifications as fall within the true spirit and scope of the invention.

The invention is claimed as follows:

1. A system for developing a gating signal whan a radio-frequency signal receiver is tuned to the center frequency of a selected radio-frequency signal, comprising: circuit means for tuning said receiver to a plurality of frequencies within a range of frequencies which includes said selected signal and for producing an intermediate frequency signal corresponding to the frequency to which said receiver is tuned, said circuit means including a frequency-synthesized local oscillator for tuning the receiver in discrete increments; frequency discriminator means coupled to said circuit means and tuned to a predetermined frequency, said frequency discriminator means being responsive to said intermediate frequency signal for developing an output signal having a DC component which varies systematically in accordance with the deviation of said intermediate frequency signal from said predetermined frequency; detecting means coupled to said discriminator means and responsive to said DC signal component for developing said gating signal, said gating signal having a first value when said DC component has a magnitude between preselected upper and lower threshold values and said gating signal having a second value when said DC component has a magnitude which is not between said upper and lower threshold values; said frequency discriminator means being further responsive to said intermediate frequency signal for generating an audio frequency electrical signal; electromechanical transducer means coupled to said frequency discriminator means and responsive to said audio frequency electrical signal for producing a corresponding audio signal; gating means coupled between said detecting means and said electromechanical transducer means and responsive to said gating signal for enabling reproduction of audio signals by said transducer means only when said gating signal has said first value; squelch means coupled to said circuit means and responsive to said intermediate frequency signal for producing a control signal having a first value when a predetermined intermediate frequency signal has an amplitude above a preselected threshold value and having a second value when said predetermined intermediate frequency signal has an amplitude below said preselected value; and switching means coupled between said squelch means and said transducer means and responsive to said control signal having said first value and said gating signal having its said first value for enabling reproduction of audio signals by said transducer means only when said amplitude of said intermediate frequency signal is above said threshold value, whereby the receiver produces an audio signal only when both the squelch means and the detecting means produce said first values of said control signal and said gating signal, respectively.

2. A system in accordance with claim 1, in which said circuit means further includes scanning means responsive to said gating signal for causing said circuit means to sequentially and incrementally tune said receiver to a plurality of radio frequencies when said gating signal has said second value and said control signal has its said second value, and to stop scanning when said gating signal has said first value and said control signal has its said first value.

3. A system in accordance with claim 2, in which said scanning means further includes digital frequency readout means coupled to said circuit means and responsive to the frequency to which said receiver is tuned for digitally displaying the value of the frequency to which said receiver is tuned, whereby the system prevents the receiver from displaying any frequency except the center frequency of the received radio frequency signal.

4. A system in accordance with claim 1, in which said detecting means includes a pair of voltage comparators and an AND gate having at least two input terminals, with one of said pair of voltage comparators being set to develop a preselected output voltage when said DC component exceeds a predetermined positive magnitude and the other comparator of said pair set to develop a preselected output voltage when said DC component exceeds a predetermined negative magnitude, and with said output voltages being applied to different input terminals of said AND gate, whereby said AND gate develops a predetermined output voltage only when both comparator output voltages have their respective preselected values.

5. In a signal-seeking receiver which automatically and incrementally scans a plurality of predetermined radio frequencies and tunes to a received signal having a frequency corresponding to one of said predetermined frequencies, a system for ensuring that the receiver continues scanning until it is tuned to the center frequency of said received signal, comprising: variable tuning means adapted to selectively tune said receiver to said predetermined frequencies and produces a corresponding intermediate frequency signal, said variable tuning means including a frequency-synthesized local oscillator for tuning the receiver in discrete increments; scanning means for causing said variable tuning means to automatically and sequentially tune said receiver to each of said predetermined frequencies; frequency discriminator means coupled to said variable tuning means and tuned to a predetermined frequency, said frequency discriminator means being responsive to said intermediate frequency signal for developing an output signal having a DC component which varies systematically in accordance with the deviation of said intermediate frequency signal from said predetermined frequency; amplitude detecting means coupled to said discriminator means and responsive to said DC signal component for developing a control signal, said control signal having a first value when said DC component is between preselected upper and lower threshold values and said control signal having a second value when said DC component is not between said upper and lower threshold values, the frequency range between said upper and lower threshold values being wider than the frequency range of said discrete increments; and switching means coupled to said scanning means and responsive to said control signal for stopping said scanning means only when said control signal has said first value said detecting means includes a pair of voltage comparators and an AND gate having at least two input terminals, with one of said pair of voltage comparators being set to develop a preselected output voltage when said DC component exceeds a predetermined positive magnitude and the other comparator of said pair set to develop a preselected output voltage when said DC component exceeds a predetermined negative magnitude, and with said output voltages being applied to different input terminals of said AND gate, whereby said AND gate develops a predetermined output voltage only when both comparator output voltages have their respective preselected values.

* * * * *